US008516399B2

(12) United States Patent
Paris et al.

(10) Patent No.: US 8,516,399 B2
(45) Date of Patent: Aug. 20, 2013

(54) COLLABORATIVE ENVIRONMENT FOR PHYSICAL VERIFICATION OF MICRODEVICE DESIGNS

(75) Inventors: James M. Paris, Portland, OR (US); William M. Hogan, Lake Oswego, OR (US); John G. Ferguson, Tualatin, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 154 days.

(21) Appl. No.: 12/708,524

(22) Filed: Feb. 18, 2010

(65) Prior Publication Data

US 2011/0016444 A1  Jan. 20, 2011

Related U.S. Application Data

(60) Provisional application No. 61/153,640, filed on Feb. 18, 2009.

(51) Int. Cl.
*G06F 17/50* (2006.01)

(52) U.S. Cl.
USPC ................ 716/51; 716/56; 716/136; 716/137

(58) Field of Classification Search
USPC ...................... 716/51, 56, 136–137
See application file for complete search history.

(56) References Cited

U.S. PATENT DOCUMENTS

| | | | | |
|---|---|---|---|---|
| 5,787,006 | A * | 7/1998 | Chevallier et al. | 716/111 |
| 5,983,277 | A * | 11/1999 | Heile et al. | 709/232 |
| 6,308,143 | B1 * | 10/2001 | Segawa | 703/1 |
| 6,922,823 | B2 * | 7/2005 | Tester | 716/112 |
| 7,003,750 | B2 * | 2/2006 | Valine | 716/122 |
| 7,003,755 | B2 * | 2/2006 | Pang et al. | 716/52 |
| 7,412,676 | B2 * | 8/2008 | Cobb et al. | 716/106 |
| 7,434,185 | B2 * | 10/2008 | Dooling et al. | 716/106 |
| 7,483,913 | B2 * | 1/2009 | Hekmatpour | 716/100 |
| 7,496,884 | B2 * | 2/2009 | Fang et al. | 716/51 |
| 7,512,508 | B2 * | 3/2009 | Rajski et al. | 702/118 |
| 7,587,695 | B2 * | 9/2009 | Petunin et al. | 716/137 |
| 7,647,575 | B2 * | 1/2010 | Koga et al. | 716/104 |
| 7,653,884 | B2 * | 1/2010 | Furnish et al. | 716/103 |
| 7,661,101 | B2 * | 2/2010 | Chadzynski | 717/164 |
| 7,685,558 | B2 * | 3/2010 | Lai et al. | 716/51 |
| 7,711,514 | B2 * | 5/2010 | Park et al. | 702/123 |
| 7,738,093 | B2 * | 6/2010 | Alles et al. | 356/237.5 |
| 7,921,393 | B2 * | 4/2011 | Furnish et al. | 716/110 |
| 7,949,990 | B2 * | 5/2011 | Pfeil et al. | 716/139 |
| 7,970,596 | B2 * | 6/2011 | Bade et al. | 703/13 |

(Continued)

OTHER PUBLICATIONS

Konduri et al.; "A Framework for Collaborative and Distributed Web-based Design"; Design Automation Conference; 1999; pp. 898-903.*

*Primary Examiner* — Naum Levin
(74) *Attorney, Agent, or Firm* — Banner & Witcoff, Ltd.

(57) ABSTRACT

A collaborative environment for performing physical verification processes on integrated circuit designs. Multiple physical verification results may be stored in a "unified" results database/directory (e.g., unified at least from a user's perspective), where results from various verification processes, such as Design-Rule-Check (DRC) processes, Layout-Versus-Schematic comparison (LVS) processes, Design-For-Manufacturing (DFM) processes Optical Proximity Correction (OPC) processes, and Optical Rule Check (ORC) processes are accessible from the same style of user interface, which may be a graphical user interface. The basic abilities for design team-based interactions can be equally available to each process involved in the physical verification of an integrated circuit design.

20 Claims, 5 Drawing Sheets

(56) References Cited

U.S. PATENT DOCUMENTS

| | | | |
|---|---|---|---|
| 8,010,917 B2* | 8/2011 | Cross et al. | 716/100 |
| 2002/0059054 A1* | 5/2002 | Bade et al. | 703/20 |
| 2005/0044514 A1* | 2/2005 | Wu et al. | 716/5 |
| 2005/0071787 A1* | 3/2005 | Koga et al. | 716/1 |
| 2005/0160396 A1* | 7/2005 | Chadzynski | 717/103 |
| 2006/0005154 A1* | 1/2006 | Cobb et al. | 716/5 |
| 2006/0200789 A1* | 9/2006 | Rittman | 716/19 |
| 2006/0228041 A1* | 10/2006 | Joshi | 382/260 |
| 2006/0253813 A1* | 11/2006 | Rittman | 716/5 |
| 2007/0150846 A1* | 6/2007 | Furnish et al. | 716/8 |
| 2008/0077891 A1* | 3/2008 | Dooling et al. | 716/4 |
| 2008/0162103 A1* | 7/2008 | White et al. | 703/13 |
| 2008/0235497 A1* | 9/2008 | Tomblin et al. | 712/225 |
| 2009/0043527 A1* | 2/2009 | Park et al. | 702/123 |
| 2009/0172623 A1* | 7/2009 | Cross et al. | 716/9 |
| 2010/0070943 A1* | 3/2010 | Koga et al. | 716/18 |

* cited by examiner

COLLABORATIVE ENVIRONMENT FOR PHYSICAL VERIFICATION OF MICRODEVICE DESIGNS

RELATED APPLICATIONS

This application claims priority under 35 U.S.C. §119 to U.S. Patent Application No. 61/153,640, filed on Feb. 18, 2009, entitled "Team Debug For Physical Verification Of Integrated Circuit Designs" and naming William M. Hogan, James M. Paris and John G. Ferguson as inventors, which application is incorporated entirely herein by reference.

FIELD OF THE INVENTION

The present invention is directed to aspects of electronic design automation tools for verifying physical designs of microdevices, such as integrated circuit devices. Various implementations of the invention allow multiple designers to collaborate on one or more processes related to verifying a physical design, such as layout-versus-schematic processes, design rule check processes, design for manufacturing processes, optical proximity correction processes, and optical rules check processes. With some implementations of the invention, multiple designers may be provided concurrent access to view, edit, annotate or delegate responsibility for a microdevice design, a portion of the microdevice design, and/or results of performing a physical verification electronic design automation process on the microdevice design or a portion of the microdevice design.

BACKGROUND OF THE INVENTION

Electronic circuits, such as integrated microcircuits, are used in a variety of products, from automobiles to microwaves to personal computers. Designing and fabricating microcircuit devices typically involves many steps, known as a "design flow." The particular steps of a design flow often are dependent upon the type of microcircuit being designed, its complexity, the design team, and the microcircuit fabricator or foundry that will manufacture the microcircuit. Typically, software and hardware "tools" will verify a design at various stages of the design flow by running software simulators and/or hardware emulators, and errors in the design are corrected.

Several steps are common to most design flows. Initially, the specification for the new microcircuit is transformed into a logical design, sometimes referred to as a register transfer level (RTL) description of the circuit. With this logical design, the circuit is described in terms of both the exchange of signals between hardware registers and the logical operations that are performed on those signals. The logical design typically employs a Hardware Design Language (HDL), such as the Very high speed integrated circuit Hardware Design Language (VHDL). The logical of the circuit is then analyzed, to confirm that the logic incorporated into the design will accurately perform the functions desired for the circuit. This analysis is sometimes referred to as "functional verification."

After the accuracy of the logical design is confirmed, it is converted into a device design by synthesis software. The device design, which is typically in the form of a schematic or netlist, describes the specific electronic devices (such as transistors, resistors, and capacitors) that will be used in the circuit, along with their interconnections. This logical generally corresponds to the level of representation displayed in conventional circuit diagrams. Preliminary timing estimates for portions of the circuit may be made at this stage, using an assumed characteristic speed for each device. In addition, the relationships between the electronic devices are analyzed, to confirm that the circuit described by the device design will correctly perform the functions desired for the circuit. This analysis is sometimes referred to as "formal verification."

Once the relationships between circuit devices have been established, the design is again transformed, this time into a physical design that describes specific geometric elements. This type of design often is referred to as a "layout" design, a "physical" design or a "physical layout" design. The geometric elements define the shapes that will be created in various materials to actually manufacture the circuit device components (e.g., contacts, gates, etc.) making up the circuit. While the geometric elements are typically polygons, other shapes, such as circular and elliptical shapes, also may be employed. These geometric elements may be custom designed, selected from a library of previously-created designs, or some combination of both. Geometric elements also are added to form the connection lines that will interconnect these circuit devices. Layout tools (often referred to as "place and route" tools), such as Mentor Graphics' IC Station or Cadence's Virtuoso, are commonly used for both of these tasks.

With a layout design, each physical layer of the microcircuit will have a corresponding layer representation, and the geometric elements described in a layer representation will define the relative locations of the circuit device components that will make up a circuit device. Thus, the geometric elements in the representation of a metal layer will define the locations in a metal layer where conductive wires used will be formed to connect the circuit devices. Typically, a designer will perform a number of analyses on the layout design, which are sometimes referred to as "physical verification." For example, the layout design may be analyzed to confirm that it accurately represents the circuit devices and their relationships described in the device design. The layout design also may be analyzed to confirm that it complies with various design requirements, such as minimum spacings between geometric elements. Still further, it may be modified to include the use of redundant or other compensatory geometric elements intended to counteract limitations in the manufacturing process, enhance the optical resolution of the lithographic masks that will be created from the design, etc.

After the layout design has been finalized, then it is converted into a format that can be employed by a mask or reticle writing tool to create a mask or reticle for use in a photolithographic manufacturing process. Masks and reticles are typically made using tools that expose a blank reticle to an electron or laser beam. Most mask writing tools are able to only "write" certain kinds of polygons, however, such as right triangles, rectangles or other trapezoids. Moreover, the sizes of the polygons are limited physically by the maximum beam aperture size available to the tool. Accordingly, larger geometric elements in the layout design, or geometric elements that are not basic right triangles, rectangles or trapezoids (which typically is a majority of the geometric elements in a layout design) must be "fractured" into the smaller, more basic polygons that can be written by the mask or reticle writing tool. Once the layout design has been fractured, then the layout design data can be converted to a format compatible with the mask or reticle writing tool.

Because of the complexity of modern integrated circuit designs, a design plan for an integrated circuit is often broken up into design blocks (or even smaller units referred to as "cells"). Separate teams of designers can then create the design (including the physical layout design) for each block, and the completed physical layout design blocks are assembled into a physical layout design for the entire integrated circuit. As the design teams begin to assemble their physical layout design blocks into a design for the entire integrated circuit, however, the task of physical verification becomes more difficult. New errors can appear in the context of the whole design that were not present when verifying the component cells or blocks in isolation. These errors must be addressed (i.e., "debugged") before the physical layout design for the complete integrated circuit can be approved for manufacturing. Accordingly, verifying and approving a physical layout design for an entire integrated circuit, sometimes referred to as "sign-off," is a lengthy process falling at the end of the integrated circuit design cycle, when delays can mean the difference between meeting or missing a design project's deadline.

While the task of integrated circuit physical design assembly and verification has traditionally been the responsibility of a select number of individuals who can address errors in the combined physical layout design that occur due to the interactions between component cells or blocks, the entire design group typically must work closely together to achieve this task. With conventional design techniques, design teams collaborate using a host of traditional methods. These may include written lists, both paper and electronic, team meetings, multiple emails and of course personal visits interactions to discuss various approaches for addressing errors in the design. These conventional design techniques can be laborious and time-consuming, however, and their efficiency is highly dependent upon the personal management skills of both the design team leaders and the individual members of the design team.

BRIEF SUMMARY OF THE INVENTION

Aspects of the invention relate to a collaborative environment for performing physical verification processes on integrated circuit designs. With some examples of the invention, a physical verification team debug tool for allowing collaborative physical verification of an integrated circuit design may be integrated into a viewing component of a physical verification tool. Alternately or additionally, a plug-in for a viewing component of a physical verification tool may be used to enable the team collaborative environment according to various embodiments of the invention. With various examples of the invention, communication between team members may be provided by a cryptographically secure mechanism.

With some implementations of the invention, multiple physical verification results may be stored in a "unified" results database/directory (e.g., unified at least from a user's perspective), where results from various verification processes, such as Design-Rule-Check (DRC) processes, Layout-Versus-Schematic comparison (LVS) processes, Design-For-Manufacturing (DFM) processes Optical Proximity Correction (OPC) processes, and Optical Rule Check (ORC) processes are accessible from the same style of user interface, which may be a graphical user interface. With various examples of the invention, the basic abilities for design team-based interactions are equally available to each process involved in the physical verification of an integrated circuit design.

With some implementations of the invention, verification results from a physical verification process may be made available to one or more designers for user action while the verification process run is still completing. With these implementations, "tags" may be used to indicate result sets that are complete. The imbedded run and results availability present in the Incremental Design Rule Check tool in the CALIBRE® family of software tools available from Mentor Graphics Corporation of Wilsonville, Oreg., is an example of a use model that may be employed with various implementations of the invention.

These and other features and aspects of the invention will be apparent upon consideration of the following detailed description.

DETAILED DESCRIPTION OF THE INVENTION

Illustrative Operating Environment

Various examples of a collaborative environment for one or more electronic design automation processes according to embodiments of the invention may be implemented by one or more programmable computing devices executing computer-executable software instructions. Alternately or additionally, various examples of a collaborative environment for one or more electronic design automation processes according to embodiments of the invention may be implemented by computer-executable software instructions stored in a computer-readable medium, such as a magnetic or optical storage device, or a solid state memory device. Because these embodiments of the invention may be implemented using software instructions, the components and operation of a generic programmable computer system through which various embodiments of the invention may be employed will first be described.

Further, because of the complexity of some electronic design automation processes and the large size of many circuit designs, various electronic design automation tools that may incorporate embodiments of the invention are configured to operate on a computing system capable of simultaneously running multiple processing threads. The components and operation of a computer network having a host or master computer and one or more remote or servant computers therefore will be described with reference to FIG. 1. This operating environment is only one example of a suitable operating environment, however, and is not intended to suggest any limitation as to the scope of use or functionality of various embodiments of the invention.

Figure 1:
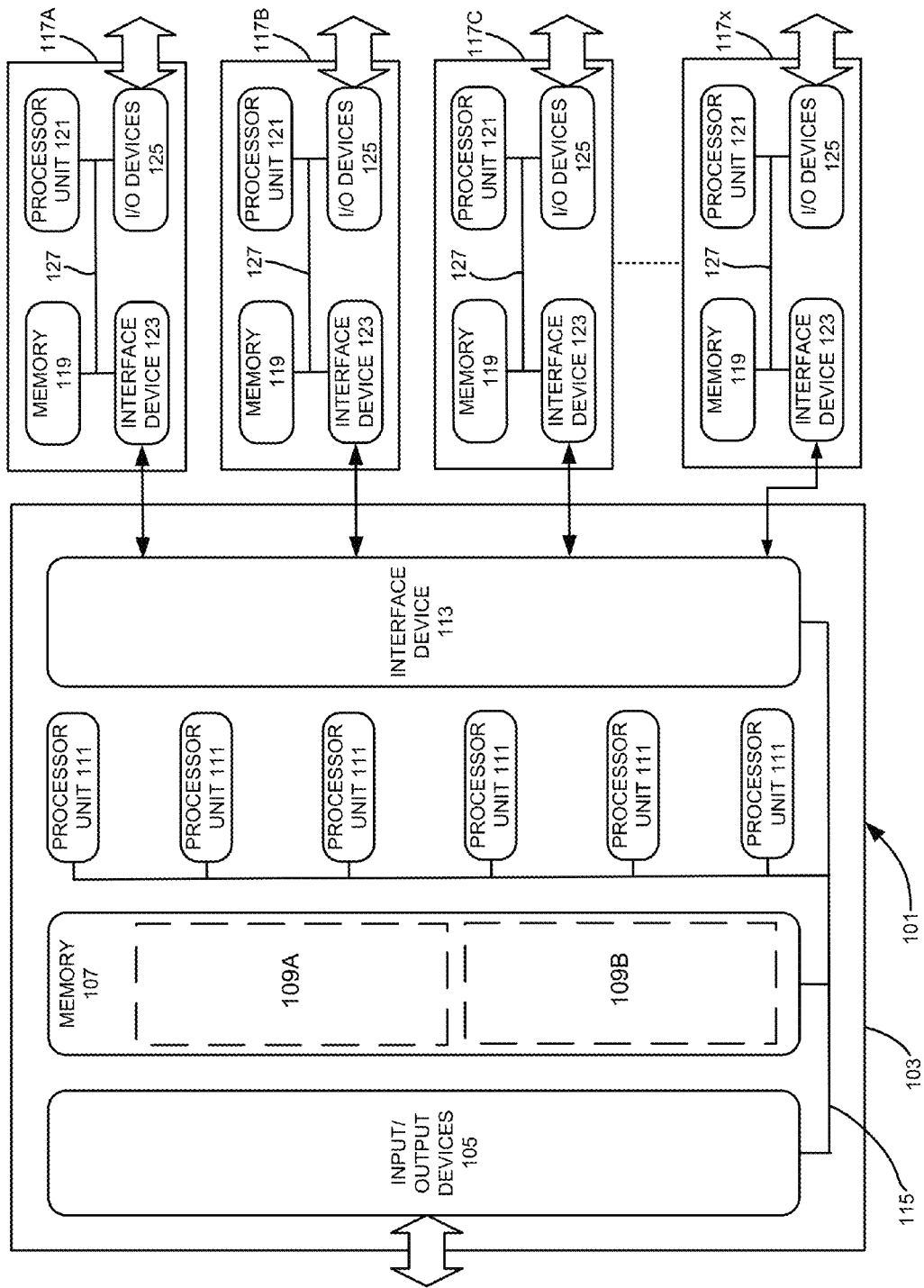
FIG. 1 illustrates an example of a computing system that may be used to implement various embodiments of the invention.

In FIG. 1, the computer network 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

As will be discussed in detail below, the master computer 103 runs a software application for performing one or more operations according to various examples of the invention. Accordingly, the memory 107 stores software instructions 109A that, when executed, will implement a software application for performing one or more operations. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor, such as Intel® Pentium® or Xeon™ microprocessors, Advanced Micro Devices Athlon™ microprocessors or Motorola 68K/Coldfire® microprocessors. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

Figure 2:
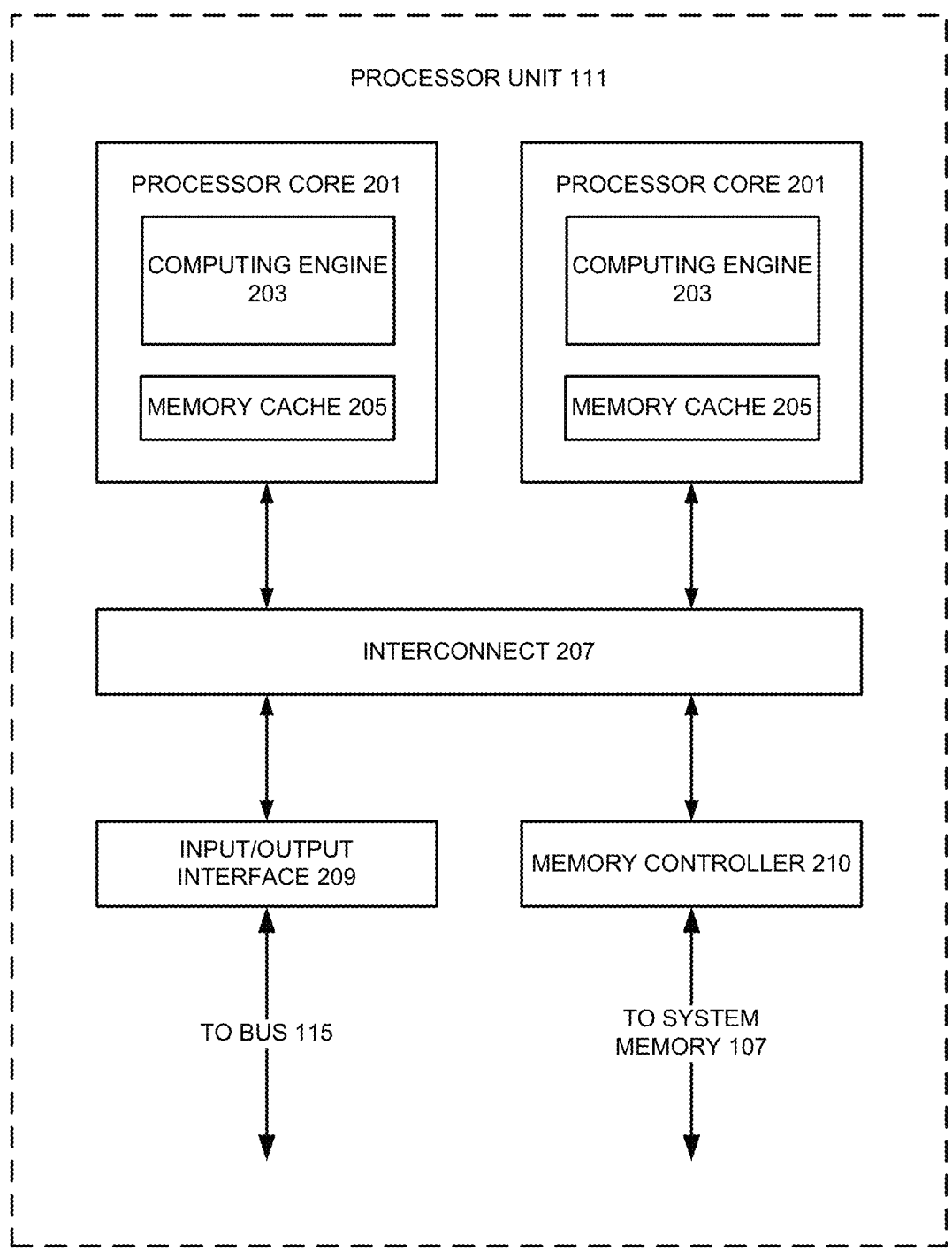
FIG. 2 illustrates an example of a multi-core processor unit that may be used to implement various embodiments of the invention.

With some implementations of the invention, the master computing device 103 may employ one or more processing units 111 having more than one processor core. Accordingly, FIG. 2 illustrates an example of a multi-core processor unit 111 that may be employed with various embodiments of the invention. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 201. With some processor cores 201, such as the Cell microprocessor created by Sony Corporation, Toshiba Corporation and IBM Corporation, the interconnect 207 may be implemented as an interconnect bus. With other processor units 201, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 211. The input/output interface 209 provides a communication interface between the processor unit 201 and the bus 115. Similarly, the memory controller 211 controls the exchange of information between the processor unit 201 and the system memory 107. With some implementations of the invention, the processor units 201 may include additional components, such as a high-level cache memory accessible shared by the processor cores 201.

While FIG. 2 shows one illustration of a processor unit 201 that may be employed by some embodiments of the invention, it should be appreciated that this illustration is representative only, and is not intended to be limiting. For example, some embodiments of the invention may employ a master computer 103 with one or more Cell processors. The Cell processor employs multiple input/output interfaces 209 and multiple memory controllers 211. Also, the Cell processor has nine different processor cores 201 of different types. More particularly, it has six or more synergistic processor elements (SPEs) and a power processor element (PPE). Each synergistic processor element has a vector-type computing engine 203 with 428×428 bit registers, four single-precision floating point computational units, four integer computational units, and a 556 KB local store memory that stores both instructions and data. The power processor element then controls that tasks performed by the synergistic processor elements. Because of its configuration, the Cell processor can perform some mathematical operations, such as the calculation of fast Fourier transforms (FFTs), at substantially higher speeds than many conventional processors.

It also should be appreciated that, with some implementations, a multi-core processor unit 111 can be used in lieu of multiple, separate processor units 111. For example, rather than employing six separate processor units 111, an alternate implementation of the invention may employ a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the servant computers 117A, 117B, 117C . . . 117x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the servant computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each servant computer 117 may include a memory 119, a processor unit 121, an interface device 123, and, optionally, one more input/output devices 125 connected together by a system bus 127. As with the master computer 103, the optional input/output devices 125 for the servant computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. For example, with some implementations of the invention, one or more of the processor units 121 may be a Cell processor. The memory 119 then may be implemented using any combination of the computer readable media discussed above. Like the interface device 113, the interface devices 123 allow the servant computers 117 to communicate with the master computer 103 over the communication interface.

In the illustrated example, the master computer 103 is a multi-processor unit computer with multiple processor units 111, while each servant computer 117 has a single processor unit 121. It should be noted, however, that alternate implementations of the invention may employ a master computer having single processor unit 111. Further, one or more of the servant computers 117 may have multiple processor units 121, depending upon their intended use, as previously discussed. Also, while only a single interface device 113 or 123 is illustrated for both the master computer 103 and the servant computers, it should be noted that, with alternate embodiments of the invention, either the computer 103, one or more of the servant computers 117, or some combination of both may use two or more different interface devices 113 or 123 for communicating over multiple communication interfaces.

With various examples of the invention, the master computer 103 may be connected to one or more external data storage devices. These external data storage devices may be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the invention, one or more of the servant computers 117 may alternately or additionally be connected to one or more external data storage devices. Typically, these external data storage devices will include data storage devices that also are connected to the master computer 103, but they also may be different from any data storage devices accessible by the master computer 103.

It also should be appreciated that the description of the computer network illustrated in FIG. 1 and FIG. 2 is provided as an example only, and it not intended to suggest any limitation as to the scope of use or functionality of alternate embodiments of the invention.

Electronic Design Automation

As previously noted, various embodiments of the invention are related to electronic design automation. In particular, various implementations of the invention may be used to improve the operation of electronic design automation software tools that identify, verify and/or modify design data for manufacturing a microdevice, such as a microcircuit. As used herein, the terms "design" and "design data" are intended to encompass data describing an entire microdevice, such as an integrated circuit device or micro-electromechanical system (MEMS) device. This term also is intended to encompass a smaller set of data describing one or more components of an entire microdevice, however, such as a layer of an integrated circuit device, or even a portion of a layer of an integrated circuit device. Still further, the terms "design" and "design data" also are intended to encompass data describing more than one microdevice, such as data to be used to create a mask or reticle for simultaneously forming multiple microdevices on a single wafer.

Designing and fabricating microcircuit devices involve many steps during a 'design flow' process. These steps are highly dependent on the type of microcircuit, its complexity, the design team, and the fabricator or foundry that will manufacture the microcircuit from the design. Several steps are common to most design flows, however. First, a design specification is modeled logically, typically in a hardware design language (HDL). Once a logical design has been created, various logical analysis processes are performed on the design to verify its correctness. More particularly, software and hardware "tools" verify that the logical design will provide the desired functionality at various stages of the design flow by running software simulators and/or hardware emulators, and errors are corrected. For example, a designer may employ one or more functional logic verification processes to verify that, given a specified input, the devices in a logical design will perform in the desired manner and provide the appropriate output.

In addition to verifying that the devices in a logic design will provide the desired functionality, some designers may employ a design logic verification process to verify that the logical design meets specified design requirements. For example, a designer may create rules such as, e.g., every transistor gate in the design must have an electrical path to ground that passes through no more than three other devices, or every transistor that connects to a specified power supply also must be connected to a corresponding ground node, and not to any other ground node. A design logic verification process then will determine if a logical design complies with specified rules, and identify occurrences where it does not.

After the logical design is deemed satisfactory, it is converted into physical design data by synthesis software. This physical design data or "layout" design data may represent, for example, the geometric elements that will be written onto a mask used to fabricate the desired microcircuit device in a photolithographic process at a foundry. For conventional mask or reticle writing tools, the geometric elements typically will be polygons of various shapes. Thus, the layout design data usually includes polygon data describing the features of polygons in the design. It is very important that the physical design information accurately embody the design specification and logical design for proper operation of the device. Accordingly, after it has been created during a synthesis process, the physical design data is compared with the original logical design schematic in a process sometimes referred to as a "layout-versus-schematic" (LVS) process.

Once the correctness of the logical design has been verified, and geometric data corresponding to the logical design has been created in a layout design, the geometric data then may be analyzed. For example, because the physical design data is employed to create masks used at a foundry, the data must conform to the foundry's requirements. Each foundry specifies its own physical design parameters for compliance with their processes, equipment, and techniques. Accordingly, the design flow may include a process to confirm that the design data complies with the specified parameters. During this process, the physical layout of the circuit design is compared with design rules in a process commonly referred to as a "design rule check" (DRC) process. In addition to rules specified by the foundry, the design rule check process may also check the physical layout of the circuit design against other design rules, such as those obtained from test chips, general knowledge in the industry, previous manufacturing experience, etc.

With modern electronic design automation design flows, a designer may additionally employ one or more "design-for-manufacture" (DFM) software tools. As previously noted, design rule check processes attempt to identify, e.g., elements representing structures that will almost certainly be improperly formed during a manufacturing process. "Design-For-Manufacture" tools, however, provide processes that attempt to identify elements in a design representing structures with a significant likelihood of being improperly formed during the manufacturing process. A "design-for-manufacture" process may additionally determine what impact the improper formation of the identified elements will have on the yield of devices manufactured from the circuit design, and/or modifications that will reduce the likelihood that the identified elements will be improperly formed during the manufacturing process. For example, a "design-for-manufacture" (DFM) software tool may identify wires that are connected by only a single via, determine the yield impact for manufacturing a circuit from the design based upon the probability that each individual single via will be improperly formed during the manufacturing process, and then identify areas where redundant vias can be formed to supplement the single vias.

It should be noted that, in addition to "design-for-manufacture," various alternate terms are used in the electronic design automation industry. Accordingly, as used herein, the term "design-for-manufacture" or "design-for-manufacturing" is intended to encompass any electronic design automation process that identifies elements in a design representing structures that may be improperly formed during the manufacturing process. Thus, "design-for-manufacture" (DFM) software tools will include, for example, "lithographic friendly design" (LFD) tools that assist designers to make trade-off decisions on how to create a circuit design that is more robust and less sensitive to lithographic process windows. They will also include "design-for-yield" (DFY) electronic design automation tools, "yield assistance" electronic design automation tools, and "chip cleaning" and "design cleaning" electronic design automation tools.

After a designer has used one or more geometry analysis processes to verify that the physical layout of the circuit design is satisfactory, the designer may then perform one or more simulation processes to simulate the operation of a manufacturing process, in order to determine how the design will actually be realized by that particular manufacturing process. A simulation analysis process may additionally modify the design to address any problems identified by the simulation. For example, some design flows may employ one or more processes to simulate the image formed by the physical layout of the circuit design during a photolithographic process, and then modify the layout design to improve the resolution of the image that it will produce during a photolithography process.

These resolution enhancement techniques (RET) may include, for example, modifying the physical layout using optical proximity correction (OPC) or by the addition of sub-resolution assist features (SRAF). Other simulation analysis processes may include, for example, phase shift mask (PSM) simulation analysis processes, etch simulation analysis processes and planarization simulation analysis processes. Etch simulation analysis processes simulate the removal of materials during a chemical etching process, while planarization simulation processes simulate the polishing of the circuit's surface during a chemical-mechanical etching process. These simulation analysis processes may identify, for example, regions where an etch or polishing process will not leave a sufficiently planar surface. These simulation analysis processes may then modify the physical layout design to, e.g., include more geometric elements in those regions to increase their density.

Once a physical layout design has been finalized, the geometric elements in the design are formatted for use by a mask or reticle writing tool. Masks and reticles typically are made using tools that expose a blank reticle or mask substrate to an electron or laser beam (or to an array of electron beams or laser beams), but most mask writing tools are able to only "write" certain kinds of polygons, however, such as right triangles, rectangles or other trapezoids. Moreover, the sizes of the polygons are limited physically by the maximum beam (or beam array) size available to the tool. Accordingly, the larger geometric elements in a physical layout design data will typically be "fractured" into the smaller, more basic polygons that can be written by the mask or reticle writing tool.

It should be appreciated that various design flows may repeat one or more processes in any desired order. Thus, with some design flows, geometric analysis processes can be interleaved with simulation analysis processes and/or logical analysis processes. For example, once the physical layout of the circuit design has been modified using resolution enhancement techniques, then a design rule check process or design-for-manufacturing process may be performed on the modified layout, Further, these processes may be alternately repeated until a desired degree of resolution for the design is obtained. Similarly, a design rule check process and/or a design-for-manufacturing process may be employed after an optical proximity correction process, a phase shift mask simulation analysis process, an etch simulation analysis process or a planarization simulation analysis process. Examples of electronic design tools that employ one or more of the logical analysis processes, geometry analysis processes or simulation analysis processes discussed above are described in U.S. Pat. No. 6,230,299 to McSherry et al., issued May 8, 2001, U.S. Pat. No. 6,249,903 to McSherry et al., issued Jun. 19, 2001, U.S. Pat. No. 6,339,836 to Eisenhofer et al., issued Jan. 15, 2002, U.S. Pat. No. 6,397,372 to Bozkus et al., issued May 28, 2002, U.S. Pat. No. 6,415,421 to Anderson et al., issued Jul. 2, 2002, and U.S. Pat. No. 6,425,113 to Anderson et al., issued Jul. 23, 2002, each of which are incorporated entirely herein by reference. It also should be appreciated that various physical verification processes described above, such as the design-rule-check, design-for-manufacturing, optical proximity correction and optical-rules-check processes, may be used to verify designs for non-electrical microdevices, such as micro-electro-mechanical system (MEMS) microdevices.

Software Tools for Simulation, Verification or Modification of a Circuit Layout

To facilitate an understanding of various embodiments of the invention, one such software tool for automatic design automation, directed to the analysis and modification of a design for an integrated circuit, will now be generally described. As previously noted, the terms "design" and "design data" are used herein to encompass data describing an entire microdevice, such as an integrated circuit device or micro-electromechanical system (MEMS) device. These terms also are intended, however, to encompass a smaller set of data describing one or more components of an entire microdevice, such as a layer of an integrated circuit device, or even a portion of a layer of an integrated circuit device. Still further, the terms "design" and "design data" also are intended to encompass data describing more than one microdevice, such as data to be used to create a mask or reticle for simultaneously forming multiple microdevices on a single wafer. As also previously noted, unless otherwise specified, the term "design" as used herein is intended to encompass any type of design, including both physical layout designs and logical designs.

Figure 3:
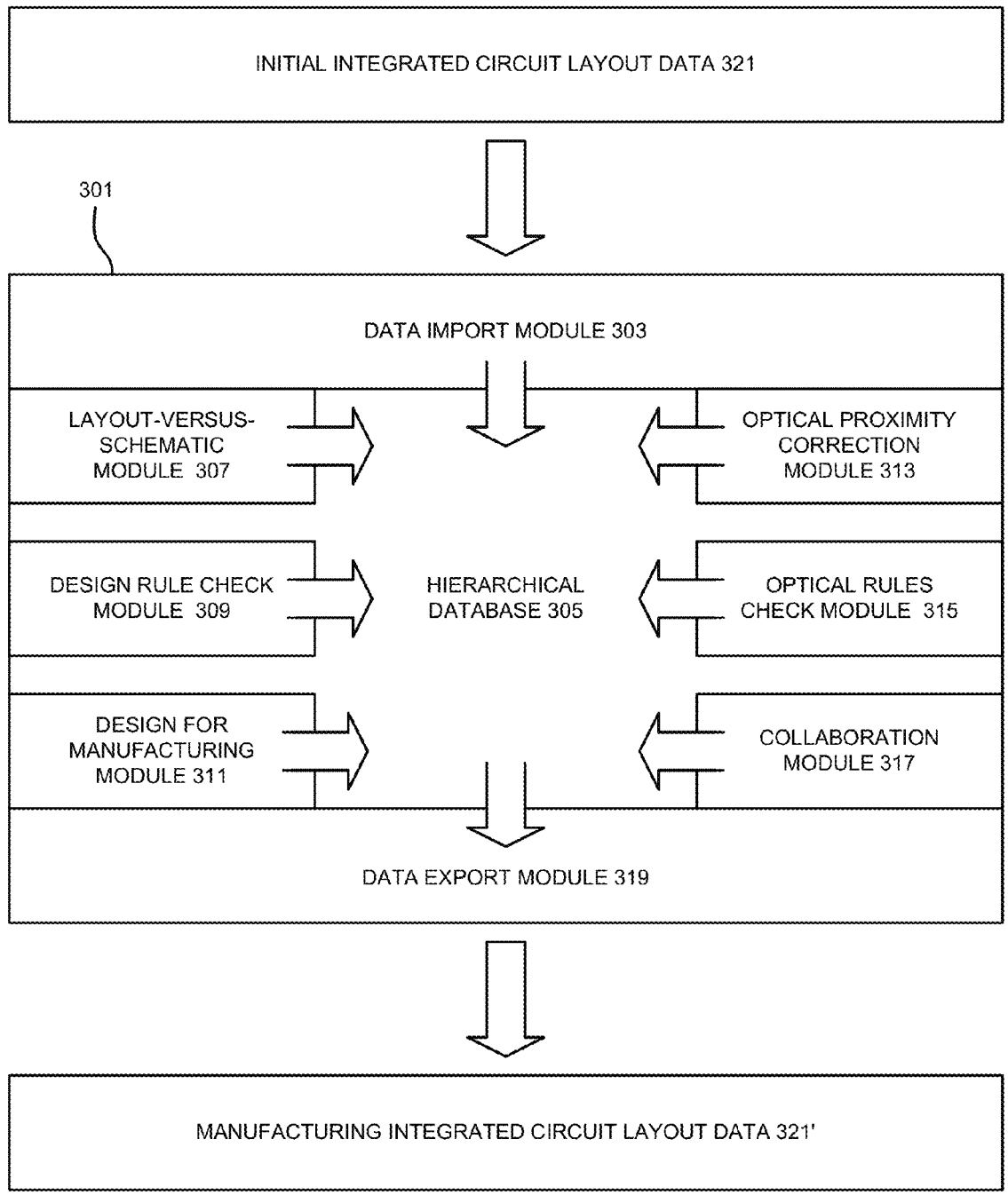
FIG. 3 schematically illustrates an example of a family of software tools for automatic design automation that may employ associative properties according to various embodiments of the invention.

FIG. 3 illustrates an analysis tool 301, which may be implemented by a variety of different software applications, such as the CALIBRE® family of software applications available from Mentor Graphics Corporation of Wilsonville, Oreg. In the illustrated example, the analysis tool includes a data import module 303 and a hierarchical database 305. The analysis tool 301 also includes a layout-versus-schematic (LVS) verification module 307, a design-rule-check (DRC) module 309, a design-for-manufacturing (DFM) module 311, an optical proximity correction (OPC) module 313, and an optical-rule-check (ORC) module 315. With various implementations of the invention, the analysis tool 301 may also have a collaboration module 317. As will be discussed in more detail below, the collaboration module 317 provides information produced by one or more of the physical verification processes and/or information contained in the hierarchical database 305 to a plurality of designers responsible for verifying an integrated circuit design. With various examples of the invention, the collaboration module 317 may be incorporated into a results viewing environment tool (such as the CALIBRE® RVE tool available from Mentor Graphics Corporation of Wilsonville, Oreg.) configured to display results produced by one or more of the physical verification processes. With still other examples of the invention, the collaboration module 317 may be a stand-alone unit or a plug-in to a results viewing environment tool configured to display results produced by one or more of the physical verification processes. The tool 301 also has a data export module 319.

While one particular examples of an analysis tool 301 is illustrated in FIG. 3, it should be appreciated that still other examples of analysis tools that may be employed with various embodiments of the invention may further include other modules for performing additional physical verification processes as desired, such as a phase shift mask (PSM) module (not shown), an etch simulation analysis module (not shown) and/or a planarization simulation analysis module (not shown). Further, some examples of analysis tools that may be employed with various embodiments of the invention may omit any of the modules described above.

Initially, the tool 301 receives data 321 describing a physical layout design for an integrated circuit. The layout design data 321 may be in any desired format, such as, for example, the Graphic Data System II (GDSII) data format or the Open Artwork System Interchange Standard (OASIS) data format proposed by Semiconductor Equipment and Materials International (SEMI). Other formats for the data 321 may include an open source format named Open Access, Milkyway by Synopsys, Inc., and EDDM by Mentor Graphics Corporation. The layout data 321 includes geometric elements for manufacturing one or more portions of an integrated circuit device. For example, the initial integrated circuit layout data 321 may include a first set of polygons for creating a photolithographic mask that in turn will be used to form an isolation region of a transistor, a second set of polygons for creating a photolithographic mask that in turn will be used to form a contact electrode for the transistor, and a third set of polygons for creating a photolithographic mask that in turn will be used to form an interconnection line to the contact electrode. The initial integrated circuit layout data 321 may be converted by the data import module 303 into a format that can be more efficiently processed by the remaining components of the tool 301.

Once the data import module 303 has converted the original integrated circuit layout data 321 to the appropriate format, the layout data 321 is stored in the hierarchical database 305 for use by the various operations executed by the modules 305-317. Next, the layout-versus-schematic module 307 checks the layout design data 321 in a layout-versus-schematic process, to verify that it matches the original design specifications for the desired integrated circuit. If discrepancies between the layout design data 321 and the logical design for the integrated circuit are identified, then the layout design data 321 may be revised to address one or more of these discrepancies. Thus, the layout-versus-schematic process performed by the layout-versus-schematic module 307 may lead to a new version of the layout design data with revisions. According to various implementations of the invention tool 301, the layout data 321 may be manually revised by a user, automatically revised by the layout-versus-schematic module 307, or some combination thereof.

Next, the design rule check module 309 confirms that the verified layout data 321 complies with defined geometric design rules. If portions of the layout data 321 do not adhere to or otherwise violate the design rules, then the layout data 321 may be modified to ensure that one or more of these portions complies with the design rules. The design rule check process performed by the design rule check module 309 thus also may lead to a new version of the layout design data with various revisions. Again, with various implementations of the invention tool 301, the layout data 321 may be manually modified by a user, automatically modified by the design rule check module 309, or some combination thereof.

The modified layout data 321 is then processed by the design for manufacturing module 311. As previously noted, a "design-for-manufacture" processes attempts to identify elements in a design representing structures with a significant likelihood of being improperly formed during the manufacturing process. A "design-for-manufacture" process may additionally determine what impact the improper formation of the identified structures will have on the yield of devices manufactured from the circuit design, and/or modifications that will reduce the likelihood that the identified structures may be improperly formed during the manufacturing process. For example, a "design-for-manufacture" (DFM) software tool may identify wires that are connected by single vias, determine the yield impact based upon the probability that each individual single via will be improperly formed during the manufacturing process, and then identify areas where redundant visa can be formed to supplement the single vias.

The processed layout data 321 is then passed to the optical proximity correction module 313, which corrects the layout data 321 for manufacturing distortions that would otherwise occur during the lithographic patterning. For example, the optical proximity correction module 313 may correct for image distortions, optical proximity effects, photoresist kinetic effects, and etch loading distortions. The layout data 321 modified by the optical proximity correction module 313 then is provided to the optical process rule check module 315

The optical process rule check module 315 (more commonly called the optical rules check module or ORC module) ensures that the changes made by the optical proximity correction module 313 are actually manufacturable, a "downstream-looking" step for layout verification. This compliments the "upstream-looking" step of the LVS performed by the LVS module 307 and the self-consistency check of the DRC process performed by the DRC module 309, adding symmetry to the verification step. Thus, each of the processes performed by the design for manufacturing process 311, the optical proximity correction module 313, and the optical process rule check module 315 may lead to a new version of the layout design data with various revisions.

As previously noted, other modules may be employed to perform alternate or additional manipulations of the layout data 321, as desired. For example, some implementations of the tool 301 may employ, for example, a phase shift mask module. As previously discussed, with a phase-shift mask (PSM) analysis (another approach to resolution enhancement technology (RET)), the geometric elements in a layout design are modified so that the pattern they create on the reticle will introduce contrast-enhancing interference fringes in the image. The tool 301 also may alternately or additionally employ, for example, an etch simulation analysis processes or a planarization simulation analysis processes. The process or processes performed by each of these additional modules may also lead to the creation of a new version of the layout data 321 that includes revisions.

After all of the desired operations have been performed on the initial layout data 321, the data export module 319 converts the processed layout data 321 into manufacturing integrated circuit layout data 323 that can be used to form one or more masks or reticules to manufacture the integrated circuit (that is, the data export module 319 converts the processed layout data 321 into a format that can be used in a photolithographic manufacturing process). Masks and reticles typically are made using tools that expose a blank reticle or mask substrate to an electron or laser beam (or to an array of electron beams or laser beams), but most mask writing tools are able to only "write" certain kinds of polygons, however, such as right triangles, rectangles or other trapezoids. Moreover, the sizes of the polygons are limited physically by the maximum beam (or beam array) size available to the tool.

Accordingly, the data export module 319 may "fracture" larger geometric elements in the layout design, or geometric elements that are not right triangles, rectangles or trapezoids (which typically are a majority of the geometric elements in a layout design) into the smaller, more basic polygons that can be written by the mask or reticle writing tool. Of course, the data export module 319 may alternately or additionally convert the processed layout data 321 into any desired type of data, such as data for use in a synthesis process (e.g., for creating an entry for a circuit library), data for use in a place-and-route process, data for use in calculating parasitic effects, etc. Further, the tool 301 may store one or more versions of the layout 321 containing different modifications, so that a designer can undo undesirable modifications. For example, the hierarchical database 305 may store alternate versions of the layout data 321 created during any step of the process flow between the modules 307-317.

Data Organization

The design of a new integrated circuit may include the interconnection of millions of transistors, resistors, capacitors, or other electrical structures into logic circuits, memory circuits, programmable field arrays, and other circuit devices. In order to allow a computer to more easily create and analyze these large data structures (and to allow human users to better understand these data structures), they are often hierarchically organized into smaller data structures, typically referred to as "cells." Thus, for a microprocessor or flash memory design, all of the transistors making up a memory circuit for storing a single bit may be categorized into a single "bit memory" cell. Rather than having to enumerate each transistor individually, the group of transistors making up a single-bit memory circuit can thus collectively be referred to and manipulated as a single unit. Similarly, the design data describing a larger 16-bit memory register circuit can be categorized into a single cell. This higher level "register cell" might then include sixteen bit memory cells, together with the design data describing other miscellaneous circuitry, such as an input/output circuit for transferring data into and out of each of the bit memory cells. Similarly, the design data describing a 128 kB memory array can then be concisely described as a combination of only 64,000 register cells, together with the design data describing its own miscellaneous circuitry, such as an input/output circuit for transferring data into and out of each of the register cells.

By categorizing microcircuit design data into hierarchical cells, large data structures can be processed more quickly and efficiently. For example, a circuit designer typically will analyze a design to ensure that each circuit feature described in the design complies with specified design rules. With the above example, instead of having to analyze each feature in the entire 128 kB memory array, a design rule check process can analyze the features in a single bit cell. If the cells are identical, then the results of the check will then be applicable to all of the single bit cells. Once it has confirmed that one instance of the single bit cells complies with the design rules, the design rule check process then can complete the analysis of a register cell simply by analyzing the features of its additional miscellaneous circuitry (which may itself be made of up one or more hierarchical cells). The results of this check will then be applicable to all of the register cells. Once it has confirmed that one instance of the register cells complies with the design rules, the design rule check software application can complete the analysis of the entire 128 kB memory array simply by analyzing the features of the additional miscellaneous circuitry in the memory array. Thus, the analysis of a large data structure can be compressed into the analyses of a relatively small number of cells making up the data structure.

With various examples of the invention, layout design data may include two different types of data: "drawn layer" design data and "derived layer" design data. The drawn layer data describes geometric elements that will be used to form structures in layers of material to produce the integrated circuit. The drawn layer data will usually include polygons that will be used to form structures in metal layers, diffusion layers, and polysilicon layers. The derived layers will then include features made up of combinations of drawn layer data and other derived layer data. Thus, with a transistor gate, derived layer design data describing the gate may be derived from the intersection of a polygon in the polysilicon material layer and a polygon in the diffusion material layer.

For example, a design rule check process performed by the design rule check module 309 typically will perform two types of operations: "check" operations that confirm whether design data values comply with specified parameters, and "derivation" operations that create derived layer data. A transistor gate design data thus may be created by the following derivation operation:

gate=diff AND poly

The results of this operation will be a "layer" of data identifying all intersections of diffusion layer polygons with polysilicon layer polygons. Likewise, a p-type transistor gate, formed by doping the diffusion layer with n-type material, is identified by the following derivation operation:

pgate=nwell AND gate

The results of this operation then will be another "layer" of data identifying all transistor gates (i.e., intersections of diffusion layer polygons with polysilicon layer polygons) where the polygons in the diffusion layer have been doped with n-type material.

A check operation performed by the design rule check module 309 will then define a parameter or a parameter range for a data design value. For example, a user may want to ensure that no metal wiring line is within a micron of another wiring line. This type of analysis may be performed by the following check operation:

external metal<1

The results of this operation will identify each polygon in the metal layer design data that are closer than one micron to another polygon in the metal layer design data.

Also, while the above operation employs drawn layer data, check operations may be performed on derived layer data as well. For example, if a user wanted to confirm that no transistor gate is located within one micron of another gate, the design rule check process might include the following check operation:

external gate<1

The results of this operation will identify all gate design data representing gates that are positioned less than one micron from another gate. It should be appreciated, however, that this check operation cannot be performed until a derivation operation identifying the gates from the drawn layer design data has been performed.

The design of a new integrated circuit may include the interconnection of millions of transistors, resistors, capacitors, or other electrical structures into logic circuits, memory circuits, programmable field arrays, and other circuit devices. In order to allow a computer to more easily create and analyze these large data structures (and to allow human users to better understand these data structures), they are often hierarchically organized into smaller data structures, typically referred to as "cells." Thus, for a microprocessor or flash memory design, all of the transistors making up a memory circuit for storing a single bit may be categorized into a single "bit memory" cell. Rather than having to enumerate each transistor individually, the group of transistors making up a single-bit memory circuit can thus collectively be referred to and manipulated as a single unit. Similarly, the design data describing a larger 16-bit memory register circuit can be categorized into a single cell. This higher level "register cell" might then include sixteen bit memory cells, together with the design data describing other miscellaneous circuitry, such as an input/output circuit for transferring data into and out of each of the bit memory cells. Similarly, the design data describing a 128 kB memory array can then be concisely described as a combination of only 64,000 register cells, together with the design data describing its own miscellaneous circuitry, such as an input/output circuit for transferring data into and out of each of the register cells.

By categorizing microcircuit design data into hierarchical cells, large data structures can be processed more quickly and efficiently. For example, a circuit designer typically will analyze a design to ensure that each circuit feature described in the design complies with design rules specified by the foundry that will manufacture microcircuits from the design. With the above example, instead of having to analyze each feature in the entire 128 kB memory array, a design rule check process can analyze the features in a single bit cell. The results of the check will then be applicable to all of the single bit cells. Once it has confirmed that one instance of the single bit cells complies with the design rules, the design rule check process then can complete the analysis of a register cell simply by analyzing the features of its additional miscellaneous circuitry (which may itself be made of up one or more hierarchical cells). The results of this check will then be applicable to all of the register cells. Once it has confirmed that one instance of the register cells complies with the design rules, the design rule check software application can complete the analysis of the entire 128 kB memory array simply by analyzing the features of the additional miscellaneous circuitry in the memory array. Thus, the analysis of a large data structure can be compressed into the analyses of a relatively small number of cells making up the data structure.

Collaborative Environment

Figure 4:
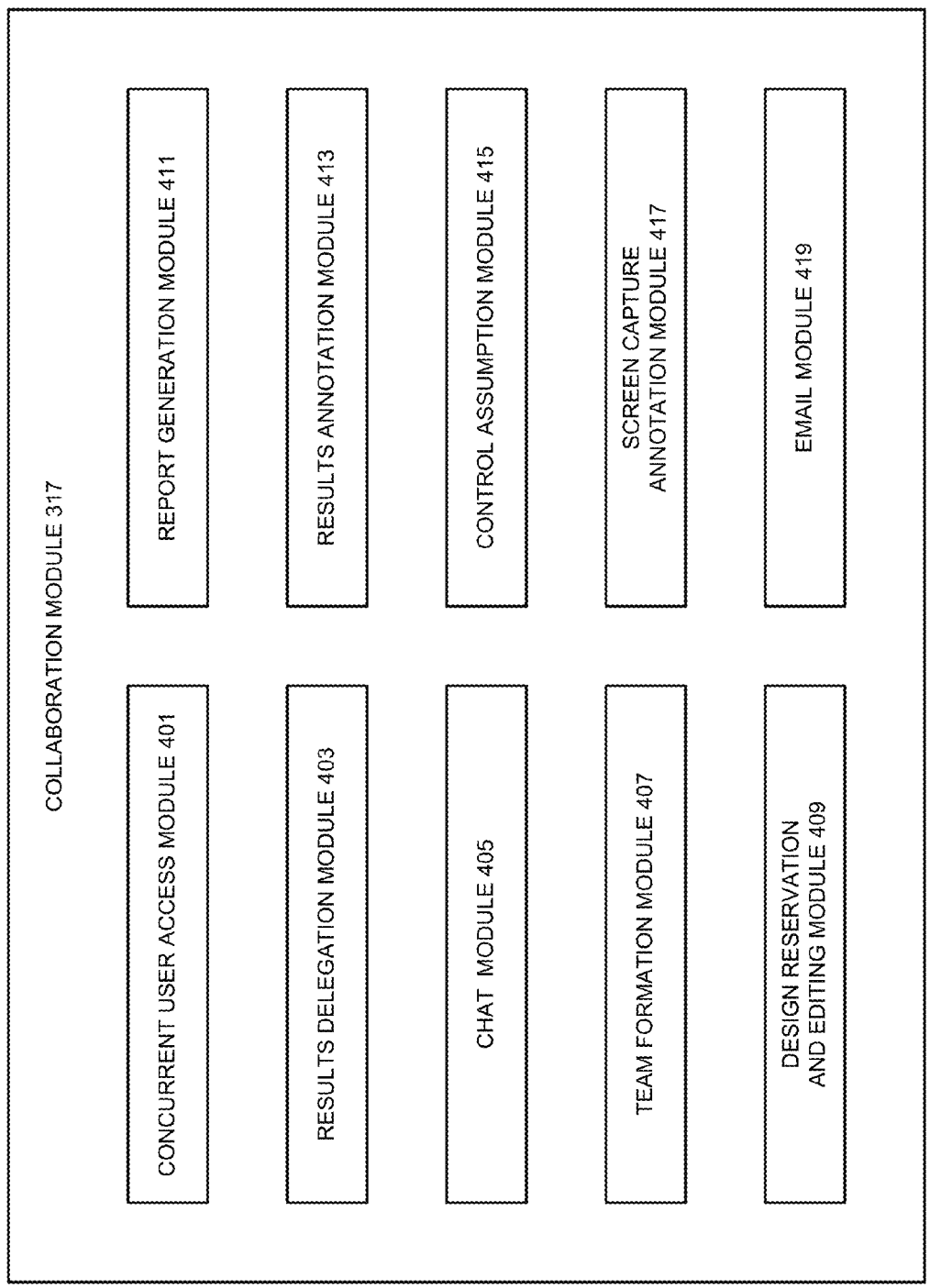
FIG. 4 illustrates an example of a collaboration module that may be implemented in the analysis tool shown in FIG. 3 according to various implementations of the invention.

According to various examples of the invention provide a collaborative environment that allows a plurality of designers to collaborate in the review, revision and approval of layout design data during a verification process. For example, as previously noted, the analysis tool 301 may include a collaboration module 317 that allows a plurality of designers to review, analyze, and modify design data processed by the verification process in the tool 301. FIG. 4 illustrates an example of a collaboration module 317 that may be implemented in the analysis tool 301 according to various implementations of the invention. As seen in this figure, the collaboration module 317 includes a concurrent user access module 401, a results delegation module 403, a chat module 405, a team formation module 407, a design reservation and editing module 409, a report generation module 411, a results annotation module 413, a control assumption module 415, a screen capture annotation module 417, and an electronic mail (email) module 419. The operation of each of the modules will be discussed in more detail below. It should be appreciated, however, that while each of the modules 401-419 are shown and described as separate and discrete units, various examples of the invention may merge, divide, or otherwise regroup the functions of two or more of these modules 401-419 in any desired combination.

With various examples of the invention, the concurrent user access module 401 allows multiple users of the analysis tool 301 to simultaneously open and view physical verification process results generated by the analysis tool 301, integrated circuit design data and log files reflecting the operation of the physical verification processes in the analysis tool 301. With some implementations of the invention, the concurrent user access module 401 may place restrictions on editing the data it provides to the users. For example, the concurrent user access module 401 may prohibit one user from editing data being viewed by another user. Alternately or additionally, the concurrent user access module 401 may give different users different permissions for editing data (e.g., permitting one user to edit results of a physical verification process, but not allowing that user to edit the original design data, but permitting a second user to edit both results of a physical verification process and original design data). Various techniques for allowing multiple users to concurrently view and selectively edit other types of data are well-known, and the concurrent user access module 401 may use any of these techniques to allow multiple users to concurrently view and selectively edit data used and produced by the analysis tool 301.

According to various examples of the invention, the results delegation module 403 allows results produced by one or more of the physical verification processes to be assigned to different individual designers, different design teams, or some combination of both. With various implementations of the invention, the results delegation module 403 may delegate physical verification results provided directly by a physical verification process, physical verification results written to the results database, or some combination of both. The results delegation module 403 may employ a simple delegation mechanism such as, for example, a simple list selection in an extra column of the results summary display. It also allow for a specific issue reflected in the physical verification results to be assigned to a particular designer or a design team. With various implementations of the invention, these designations will be persistent.

With some implementations of invention, the results delegation module 403 may delegate physical verification results on an automatic basis. For example, the results delegation module 403 may employ a user configurable assignment of results to automatically delegate all physical verification results relating to a first design block or cell to a first designer or design team, and delegate all physical verification results relating to a second design block or cell to a second designer or design team. This could be implemented, for example, with a scripted approach. Some implementations of the results delegation module 403 may alternately or additionally be configured to allow physical verification results to be manually delegated to a designer or design team. For example, these implementations of the invention may allow a user to assign a specific design error to a particular designer or design team.

Figure 5:
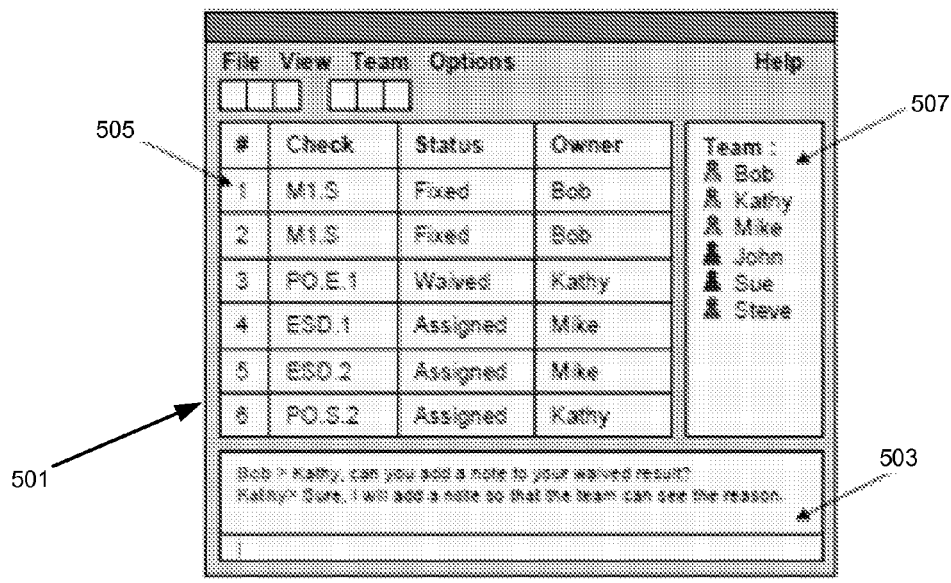
FIG. 5 illustrates a chat interface that may be provided according to various embodiments of the invention.

With various examples of the invention, the chat module 405 provides a chat interface for ongoing electronic communication between designers on a same design team, designers on different design teams, or some combination of both. With some implementations, the chat interface also may be used to send complex elements, like a screen location, or x,y coordinates that can be easily selected by a computer pointing device (e.g., "clicked on") to zoom to that part of the design. For example, FIG. 5 illustrates an example of a user interface 501 that may be employed by the chat module 405 to provide a chat interface 503.

As seen in this figure, the user interface 501 also includes a results status portion 505, showing, e.g., a listing of physical verification results with the check performed to detect an error, the status of the error, and the designer to whom the results were delegated (by, e.g., the results delegation module 403). The user interface 501 further includes a networked member portion 507 showing the designers that are connected to the collaboration module 317 through a communications network, and that can thus access the chat interface 503. Of course, still other examples of the chat module 405 can provide chat interfaces that can display or otherwise exchange any desired information. For example, some implementations of the chat module 405 can allow user to exchange electronic data files via the chat interface, so it can be used to send snapshots of issues to other team members to communicate a specific issue. With various examples of the invention, the chat module 405 may create and maintain a chat interface using any conventional chat tools such as, e.g., Yahoo, Google Talk, etc.

Figure 6:
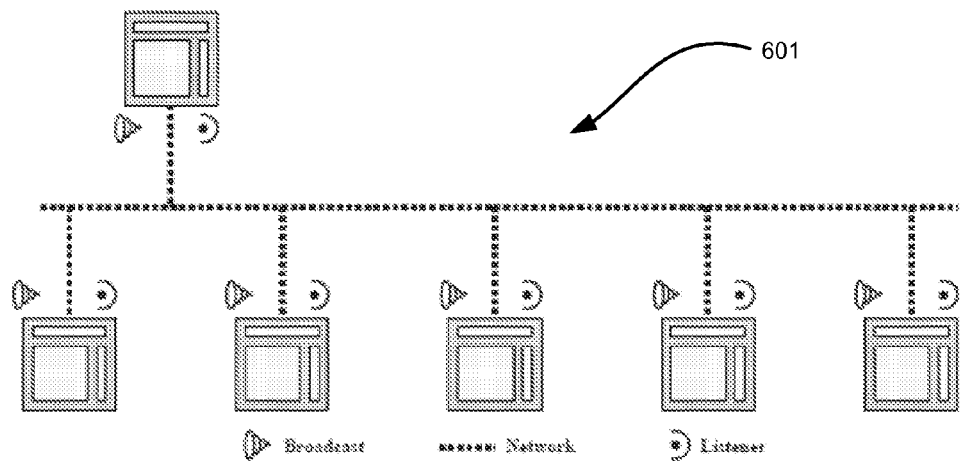
FIG. 6 illustrates an example of a communication network that may be employed to allow designers to communicate and form teams according to various embodiments of the invention.

With various examples of the invention, the team formation module 407 may allow different users (e.g., designers) on a communication network to join together to form a team. Implementations of the team formation module 407 may, for example, establish connectivity to users by using broadcast/listener technology like that used by network printers to broadcast packets across a network, such as the network 601 shown in FIG. 6. With some implementations of the invention, users may see others on the same network and optionally connect. Also, various examples of the invention may provide an authentication system, so that unapproved users are not able to join a team for which they do not have permissions.

Through the team formation module 407, users on the same network then can join together and form a team. The individual who initiates the team formation may be designated as the team lead. The team lead then may be responsible for adding/removing team members, assigning results to team members and consolidating results from other team members. The team lead also may assign a password to join the team. With various examples of the invention, it may be possible to have users join a team that are not on the same network. Some of these implementations may require additional permissions to do so. For example, some of these implementations may use a temporary password that will allow the joining of a temporary team member, like someone from customer support, an external consultant, or a member of another team providing temporary assistance. With still other implementations of the invention, however, the teams may be statically created, where the teams are designated before a design flow process and maintained throughout the process. In some cases, team formation module 407 may employ permission settings that allow team member inequities. Some members may have full edit rights, for example, while others may only have read-only access to some/all of the information available. Typically, a team member will only be able to edit results that have been assigned to them.

With various implementations of the invention, the design reservation and editing module 409 may allow a designer or design team to "reserve" a part of the design currently being edited, to prevent other designer from making change to that part of the design that would interfere with those edits. It should be noted that many electronic design automation physical verification tools (such as those that might be employed by the modules 303-315 and 319 in the analysis tool 301) already have interaction management features for multiple users. Accordingly, various examples of the invention may honor the settings provided by those management features. Still further, the design reservation and editing module 409 may be incorporated in or otherwise cooperate with the concurrent user access module 401.

With some implementations of the invention, the design reservation and editing module 409 may alternately or additionally maintain a list of modified design blocks, cells or other discrete design units. This list could then be used at the end of the verification debug process to focus incremental checking, such as the type of checking performed by the CALIBRE Incremental DRC tool available from Mentor Graphics Corporation of Wilsonville, Oreg. With these implementations, it may be desirable to have team members run their own incremental verification on the fixes they implement, for example. Possible partitioning units for the design may include by cell, by name, by type, and by individual.

With various examples of the invention, the report generation module 411 may be used to create reports that include design errors, waived design problems, fixed design problems or some combination thereof. Some implementations of the invention will allow multiple standard formats of reports to be created, with users being able to share these reports. With some examples of the invention, each report may be saved in a "reports" section of the hierarchical database 305 or in a separate design database/directory for easy reference by other team members. Various examples of the invention may allow a user (e.g., a team member) to send the "link" of a report to a specified destination or person, or extract it in HTML, RTF of PDF for inclusion in other documentation.

A report generation module 411 according to various examples of the invention may allow a user to view issues with the design in a convenient manner that supports cross selection of similar or related issues in the document, in addition to the original design, if it has not been altered. With some implementations of the invention, this functionality may be accessed like a book, with multiple "pages" describing different issues. A list of issues may be displayed, or all issues from one cell or geographic region of the design, for example. Also, with various examples of the invention, the report generation module 411 may allow a user to save multiple named reports for results being viewed. This can facilitate collaboration between designers for quickly identifying areas of interest. For example, a junior designer may save five "short" errors that have been identified in physical verification results, and two "soft connection" problems identified in the results. This report can then be viewed by a more senior designer, who can add notes to the report for instructions on how to fix these problems. With various examples of the invention, these reports may be persistently maintained. Also, with some implementations of the invention, it may be possible to annotate the report with comment text from multiple users.

When viewing results information, various examples of the results annotation module 413 will allow a user to annotate comments over the top of the actual physical verification results information. This results information may include, for example, text reports, graphical files and other material. The results annotation module 413 then allows each user team member will then be able to overlay their comments on the results and send them on to others for evaluation. Some implementations of the results annotation module 413 also may provide a mechanism for detecting original design changes, using, e.g., report generation functions provided by the report generation module 411. This feature allows limiting of cross selecting to a changed design that does not have the same/correct elements for selection.

With various examples of the invention, the control assumption module 415 allows a second designer (e.g., a team member) to "attach" to a second designer's (e.g., another team member's) analysis or editing session, and provide real-time interaction, using the first designer's view. Implementations of the control assumption module 415 may use any conventional graphical desktop sharing techniques, such as conventional virtual network computing (VNC) techniques.

In some implementations of the invention, the screen capture annotation module 417 allows a user to perform a screen capture (e.g., of physical verification results), annotate the captured image with text and drawing shapes, and add this to a report, send it as an email, or send directly to another user through the chat mechanism. For some of these embodiments, an already annotated picture can then store these annotations in a manner that allows further annotation by others, and viewing without annotations.

With various examples of the invention, the email module 419 will allow users to email a report, an exported report, or other data (like a screen capture), to other team members or to other users. The email module 419 may use any desired conventional electronic mail protocol, such as LDAP, MS Exchange or similar email server protocols. For some embodiments, it may be possible to enter an email address manually. Doing so, however may require an additional confirmation dialogue.

As will be appreciated by those of ordinary skill in the art, a collaboration module 317 according to various examples of the invention will allow multiple users to more efficiently physically verify an integrated circuit design. For example, when local edits are made to an integrated circuit design, various embodiments of the invention will allow the designers to re-run verification for the local changes, in addition to initiating "whole chip" verification. Still further, various implementations of the invention may provide a "check-in/check-out" mechanism to manage this process.

For example, according to various examples of the invention, after a DRC/LVS/DFM run is completed, the hierarchical database 305 or other results database/directory storing the physical verification results may be accessed by the team lead, who could then assign results to a team member employing the results delegation module 403. For performance considerations, especially on slower bandwidth connections, some implementations may allow some data to be replicated to the team member assigned specific results. Further, according to some examples of the invention, it will be possible for the user to mark issues as "Fixed", "Waived", and "Acknowledged". User defined designations also will be available with some examples of the invention. Typically, these designations will be persistent.

As designers begin debugging results, they will need to open various cells to correct errors. As cells are opened for edit, the results viewing interface for various examples of the invention will capture the name and send a "locked" status to other team members. If another team member inadvertently checks out the same cell, the interface may, for example, pop up a warning message. It should be appreciated, however, that this type of conflict is unlikely to happen unless edits are being done in different design environments.

Various examples of the invention can then provide results tracking the offer a top-level view of the status of all the results shared across the team. Results status could be, for example, one of the following values: not fixed, marked as fixed, validated as fixed, and waived. With some implementations of the invention, the results of various layout verification processes, such as DRC, LVS and DFM processes, may be displayed simultaneously.

When team members have completed their edits, and believe that their assigned tasks are completed, some implementations of the invention may allow a user to obtain a report, such as a graphical report, that identifies the sections of the design that has bee modified.

CONCLUSION

While the invention has been described with respect to specific examples including presently preferred modes of carrying out the invention, those skilled in the art will appreciate that there are numerous variations and permutations of the above described systems and techniques that fall within the spirit and scope of the invention as set forth in the appended claims. For example, while specific terminology has been employed above to refer to electronic design automation processes, it should be appreciated that various examples of the invention may be implemented using any desired combination of electronic design automation processes.

Thus, in addition to use with "design-for-manufacture" processes, various examples of the invention can be employed with "design-for-yield" (DFY) electronic design automation processes, "yield assistance" electronic design automation processes, "lithographic-friendly-design" (LFD) electronic design automation processes, including "chip cleaning" and "design cleaning" electronic design automation processes, etc. Likewise, in addition to use with "design-rule-check" electronic design automation processes, various implementations of the invention may be employed with "physical verification" electronic design automation processes. Also, in addition to being used with OPC and ORC electronic design automation processes, various implementations of the invention may be used with any type of resolution enhancement electronic design automation processes.

What is claimed is:

1. A computing device comprising:
a processor; and
a memory storing instructions that, when executed by the processor, cause the computing device to function as:
one or more physical verification process modules configured to generate physical verification results by performing at least one physical verification process on microdevice design data, wherein the at least one physical verification process comprises one or more of a design-rule-check process, a layout-versus-schematic comparison process, a design-for-manufacturing process, an optical proximity correction process, and an optical rule check process; and
a collaboration module configured to allow a plurality of designers to view, edit, and approve the microdevice design data during the at least one physical verification process, the collaboration module comprising:
a concurrent user access module configured to
allow the plurality of designers concurrent access to the physical verification results and the microdevice design data,
permit a first subset of the plurality of designers to edit only the physical verification results,
permit a second subset of the plurality of designers to edit the physical verification results and the microdevice design data, and
when a portion of the microdevice design data is being accessed by one of the second subset of the plurality of designers, permit only the one of the second subset of the plurality of designers to edit the microdevice design data.

2. The computing device of claim 1, wherein the memory further stores instructions that, when executed by the processor, cause the computing device to function as the collaboration module further comprising:
a results delegation module configured to delegate responsibility for the physical verification results to one or more of a particular designer of the plurality of designers and a design team.

3. The computing device of claim 1, wherein the memory further stores instructions that, when executed by the processor, cause the computing device to function as the collaboration module further comprising:
a chat module configured to:
provide a chat interface for allowing electronic communication between the plurality of designers based on information indicative of the physical verification results and the at least one physical verification process; and
display a respective status of each of the physical verification results,
wherein the physical verification results are available for user action while the at least one physical verification process is still completing.

4. The computing device of claim 1, wherein the memory further stores instructions that, when executed by the processor, cause the computing device to function as the collaboration module further comprising:
a team formation module configured to allow multiple designers of the plurality of designers to be organized into two or more design teams.

5. The computing device of claim 1, wherein the memory further stores instructions that, when executed by the processor, cause the computing device to function as the collaboration module further comprising:
a design reservation and editing module configured to reserve edit access to the portion of the microdevice design.

6. The computing device of claim 1, wherein the memory further stores instructions that, when executed by the processor, cause the computing device to function as the collaboration module further comprising:
a report generation module configured to generate reports containing information obtained from the physical verification results.

7. The computing device of claim 1, wherein the memory further stores instructions that, when executed by the processor, cause the computing device to function as the collaboration module further comprising:
a results annotation module configured to allow one of the plurality of designers to annotate information obtained from the physical verification results.

8. The computing device of claim 1, wherein the memory further stores instructions that, when executed by the processor, cause the computing device to function as the collaboration module further comprising:
a control assumption module configured to allow a first designer of the plurality of designers to assume control of an editing session of a second designer of the plurality of designers for editing information obtained from the physical verification results.

9. The computing device of claim 1, wherein the memory further stores instructions that, when executed by the processor, cause the computing device to function as the collaboration module further comprising:
a screen capture annotation module configured to allow one of the plurality of designers to capture and annotate an image of information obtained from the physical verification results.

10. A method comprising:
generating, by a computing device, physical verification results by performing at least one physical verification process on microdevice design data, wherein the at least one physical verification process comprises one or more of a design-rule-check process, a layout-versus-schematic comparison process, a design-for-manufacturing process, an optical proximity correction process, and an optical rule check process; and
allowing, by the computing device, a plurality of designers concurrent access to the physical verification results and the microdevice design data;

permitting, by the computing device, a first subset of the plurality of designers to edit only the physical verification results;

permitting, by the computing device, a second subset of the plurality of designers to edit the physical verification results and the microdevice design data; and when a portion of the microdevice design data is being accessed by one of the second subset of the plurality of designers, permitting, by the computing device, only the one of the second subset of the plurality of designers to edit the microdevice design data.

11. The method of claim 10, further comprising:
delegating, by the computing device, responsibility for the physical verification results to one or more of a particular designer of the plurality of designers and a design team.

12. The method of claim 10, further comprising:
providing, by the computing device, a chat interface for allowing electronic communication between designers based on information indicative of the physical verification results and the at least one physical verification process; and
displaying, by the computing device, a respective status of each of the physical verification results,
wherein the physical verification results are available for user action while the at least one physical verification process is still completing.

13. The method of claim 10, further comprising:
allowing, by the computing device, multiple designers of the plurality of designers to be organized into two or more design teams.

14. The method of claim 10, further comprising:
reserving, by the computing device, edit access to the portion of the microdevice design.

15. The method of claim 10, further comprising:
generating, by the computing device, reports containing information obtained from the physical verification results.

16. The method of claim 10, further comprising:
allowing, by the computing device, one of the plurality of designers to annotate information obtained from the physical verification results.

17. The method of claim 10, further comprising:
allowing, by the computing device, a first designer of the plurality of designers to assume control of an editing session of a second designer of the plurality of designers for editing information obtained from the physical verification results.

18. The method of claim 10, further comprising:
allowing, by the computing device, one of the plurality of designers to capture and annotate an image of information obtained from the physical verification results.

19. A non-transitory computer readable storage medium storing computer readable instructions which, when read by a computer, instruct the computer to:
generate physical verification results by performing at least one physical verification process on microdevice design data, wherein the at least one physical verification process comprises one or more of a design-rule-check process, a layout-versus-schematic comparison process, a design-for-manufacturing process, an optical proximity correction process, and an optical rule check process; and
allow a plurality of designers concurrent access to the physical verification results and the microdevice design data;
permit a first subset of the plurality of designers to edit only the physical verification results;
permit a second subset of the plurality of designers to edit the physical verification results and the microdevice design data; and
when a portion of the microdevice design data is being accessed by one of the second subset of the plurality of designers, permit only the one of the second subset of the plurality of designers to edit the microdevice design data.

20. The non-transitory computer readable storage medium of claim 19, wherein the computer readable storage medium stores further computer readable instructions which, when read by the computer, instruct the computer to:
delegate responsibility for the physical verification results to one or more of a particular designer of the plurality of designers and a design team.

* * * * *